United States Patent
You et al.

(10) Patent No.: US 11,656,707 B2
(45) Date of Patent: **\*May 23, 2023**

(54) DISPLAY DEVICE

(71) Applicant: Samsung Display Co., Ltd., Yongin-si (KR)

(72) Inventors: Wonho You, Siheung-si (KR); Do-Hoon Kim, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/566,480

(22) Filed: Dec. 30, 2021

(65) Prior Publication Data

US 2022/0129099 A1    Apr. 28, 2022

Related U.S. Application Data

(63) Continuation of application No. 17/085,885, filed on Oct. 30, 2020, now Pat. No. 11,216,100.

(30) Foreign Application Priority Data

Dec. 12, 2019    (KR) ........................ 10-2019-0165455

(51) Int. Cl.
*G06F 3/041*    (2006.01)
*G06F 3/044*    (2006.01)
(Continued)

(52) U.S. Cl.
CPC .......... *G06F 3/0412* (2013.01); *G06F 3/0446* (2019.05); *H01L 27/3276* (2013.01); *H01L 51/5246* (2013.01)

(58) Field of Classification Search
None
See application file for complete search history.

(56) References Cited

U.S. PATENT DOCUMENTS

| 9,362,531 B2 | 6/2016 | Hong et al. |
| 9,536,936 B2 | 1/2017 | Lhee et al. |

(Continued)

FOREIGN PATENT DOCUMENTS

| KR | 10-1035627 B1 | 5/2011 |
| KR | 10-2015-0043136 A | 4/2015 |
| KR | 10-2015-0108476 A | 9/2015 |

*Primary Examiner* — Duane N Taylor, Jr.
(74) *Attorney, Agent, or Firm* — Lewis Roca Rothgerber Christie LLP

(57) ABSTRACT

A display device, includes: a display unit that includes a first substrate, a second substrate facing the first substrate, and a sealant combining the first and second substrates with each other, the first substrate including an active area that displays an image and a peripheral area adjacent to the active area; and an input detection unit on the second substrate, wherein the input detection unit includes: a sensing electrode on the second substrate and corresponding to the active area; a sensing pad section on the second substrate and corresponding to the peripheral area, the sensing pad section including a plurality of sensing pads electrically connected to the sensing electrode; and a pattern section on the second substrate and corresponding to the peripheral area, the pattern section overlapping the sealant and including a plurality of conductive patterns in a floating state.

17 Claims, 17 Drawing Sheets

(51) Int. Cl.
*H01L 27/32* (2006.01)
*H01L 51/52* (2006.01)

(56) References Cited

U.S. PATENT DOCUMENTS

| | | |
|---|---|---|
| 2014/0183522 A1 | 7/2014 | Cha et al. |
| 2015/0042908 A1 | 2/2015 | Wang et al. |
| 2015/0261258 A1 | 9/2015 | Kim et al. |
| 2015/0338994 A1* | 11/2015 | Hung .................. G06F 3/0418 |
| | | 345/174 |
| 2021/0034217 A1 | 2/2021 | Liu |

* cited by examiner

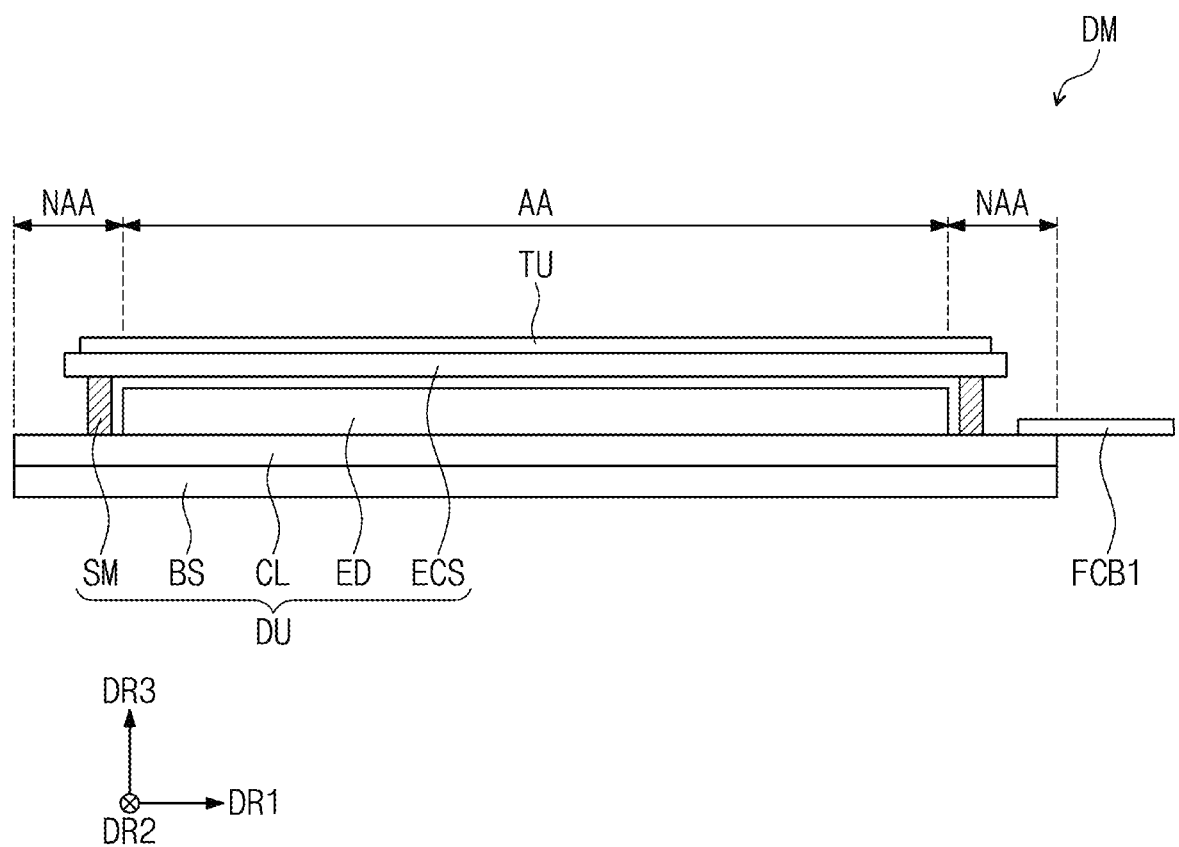

DISPLAY DEVICE

CROSS-REFERENCE TO RELATED APPLICATIONS

This application is a continuation of U.S. patent application Ser. No. 17/085,885, filed Oct. 30, 2020, now U.S. Pat. No. 11,216,100, which claims priority to and the benefit of Korean Patent Application No. 10-2019-0165455, filed Dec. 12, 2019, the entire content of both of which is incorporated herein by reference.

BACKGROUND

Aspects of some example embodiments of the present invention relate to a display device with relatively improved line failure.

A touch screen panel is an input tool that allows a user to use the hand or object to input commands by selecting an instruction content (e.g., a graphical depiction of a button, text field, etc.) on a screen of an image display device.

For this, the image display device is provided on its front surface with the touch screen panel to covert a contact location in direct contact with the user's hand or object into electrical signals. Therefore, the instruction content selected at the contact location is accepted as an input signal.

Because the touch screen panel may replace an input tool, such as keyboard and mouse, which operates while being connected to the image display device, the use of touch screen panels is gradually expanding.

The touch screen panel is generally attached to an outer surface of a flat display device, such as liquid crystal display device and organic electroluminescence display device, and thus the overall thickness of a product may increase when the product is fabricated to include the touch screen panel and the flat display device that are formed separately from each other.

The above information disclosed in this Background section is only for enhancement of understanding of the background and therefore the information discussed in this Background section does not necessarily constitute prior art.

SUMMARY

Aspects of some example embodiments of the present invention include a display device including an input detection unit that may be capable of improving line defects on a display panel.

According to some example embodiments of the present invention, a display device may include: a display unit that includes a first substrate, a second substrate that faces the first substrate, and a sealant that combines the first and second substrates with each other, the first substrate including an active area that displays an image and a peripheral area adjacent to the active area; and an input detection unit on the second substrate. The input detection unit may include: a sensing electrode that is on the second substrate and corresponds to the active area; a sensing pad section that is on the second substrate and corresponds to the peripheral area, the sensing pad section including a plurality of sensing pads electrically connected to the sensing electrode; and a pattern section that is on the second substrate and corresponds to the peripheral area, the pattern section overlapping the sealant and including a plurality of conductive patterns in a floating state.

According to some example embodiments, the first substrate may further include: a pixel that corresponds to the active area; a first power line that supplies the pixel with a first power voltage; and a second power line that supplies the pixel with a second power voltage.

According to some example embodiments, the pattern section may partially overlap the first power line, the second power line, and the sealant.

According to some example embodiments, the first substrate may further include an organic layer including an opening that partially exposes the first and second power lines. The opening may overlap the sealant.

According to some example embodiments, the first substrate may further include a signal line connected to the pixel. The signal line may be on a different layer than the first and second power lines. The pattern section may partially overlap the first power line, the second power line, the sealant, and the signal line.

According to some example embodiments, each of the conductive patterns may include: a transparent conductive pattern that includes a transparent conductive material; and a metal pattern that includes a metallic material.

According to some example embodiments, the pattern section may be divided into a plurality of pattern regions that correspond to corresponding conductive patterns. Each of the pattern regions may include: an effective pattern region where a corresponding conductive pattern is located; and an ineffective pattern region where the conductive pattern is not located.

According to some example embodiments, an area of the effective pattern region may be greater than an area of the ineffective pattern region.

According to some example embodiments, the effective pattern region may include: a first effective pattern region where the transparent conductive pattern is located; and a second effective pattern region where the metal pattern is located. The first effective pattern region may overlap the second effective pattern region.

According to some example embodiments, the first effective pattern region may have an area greater than an area of the second effective pattern region.

According to some example embodiments, on a location where the pattern section and the sealant overlap each other, an area ratio of the second effective pattern region to the pattern region may have a value that is changed based on a first interval that is defined to refer to a distance between an end of the second power line and a center of the sealant.

According to some example embodiments, the conductive patterns may be arranged in a first direction and a second direction perpendicular to the first direction. The conductive patterns may be formed in a zigzag pattern in one or more of the first and second directions.

According to some example embodiments, the input detection unit may further include: a first insulating layer that covers the metal pattern; and a second insulating layer that covers the transparent conductive pattern. The metal pattern may be on the second substrate. The transparent conductive pattern may be on the first insulating layer.

According to some example embodiments, each of the conductive patterns may include a metal pattern including a metallic material.

According to some example embodiments, the pattern section may be divided into a plurality of pattern regions that correspond to corresponding conductive patterns. Each of the pattern regions may include: an effective pattern region where the metal pattern is formed; and an ineffective pattern region where the metal pattern is not formed.

According to some example embodiments, the effective pattern region may have an area less than an area of the ineffective pattern region.

According to some example embodiments, the conductive patterns may be arranged in a first direction and a second direction perpendicular to the first direction. The conductive patterns may be formed in a zigzag pattern in one or more of the first and second directions.

According to some example embodiments, on the peripheral area, the first and second power lines may partially overlap the sealant.

According to some example embodiments, the input detection unit may further include an electrostatic shield section between the sensing electrode and the pattern section.

According to some example embodiments, the electrostatic shield section may include an electrostatic shield pattern including a metallic material. The electrostatic shield pattern may not overlap the sealant.

BRIEF DESCRIPTION OF THE DRAWINGS

FIG. 2 illustrates a simplified cross-sectional view showing a display module according to some example embodiments of the present invention.

DETAILED DESCRIPTION

Figure 1A:
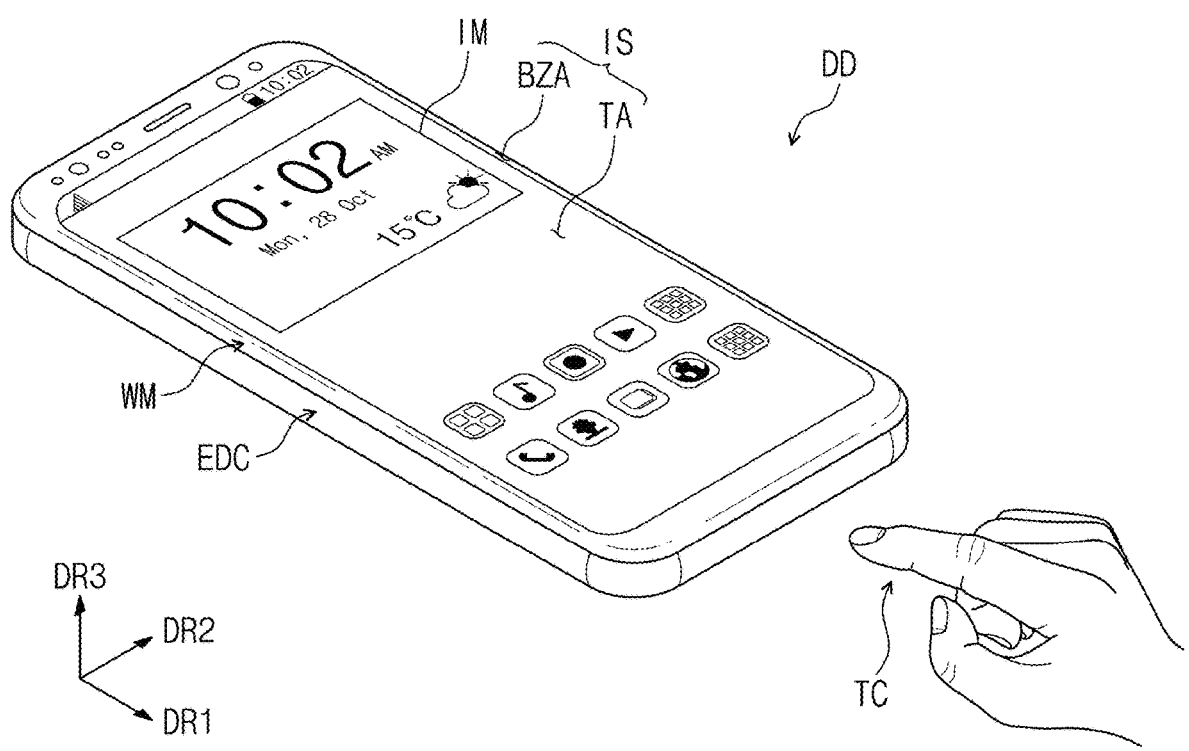
FIG. 1A illustrates an assembled perspective view showing a display device according to some example embodiments of the present invention.

In this disclosure, when a certain component (or region, layer, portion, etc.) is referred to as being "on", "connected to", or "coupled to" other component(s), the certain component may be directly formed on, directly connected to, or directly coupled to the other component(s) or at least one intervening component may be present therebetween.

Like numerals indicate like components. Moreover, in the drawings, thicknesses, ratios, and dimensions of components are exaggerated for effectively explaining the technical contents.

The term "and/or" includes one or more combinations defined by associated components.

It will be understood that, although the terms first, second, etc. may be used herein to describe various components, these components should not be limited by these terms. These terms are only used to distinguish one component from another component. For example, a first component could be termed a second component, and vice versa without departing from the scope of the present invention. Unless the context clearly indicates otherwise, the singular forms are intended to include the plural forms as well.

In addition, the terms "beneath", "lower", "above", "upper", and the like are used herein to describe one component's relationship to other component(s) illustrated in the drawings. The relative terms are intended to encompass different orientations in addition to the orientation depicted in the drawings.

Unless otherwise defined, all terms used herein including technical and scientific terms have the same meaning generally understood by one of ordinary skilled in the art. Also, terms as defined in dictionaries generally used should be understood as having meaning identical or meaning contextually defined in the art and should not be understood as ideally or excessively formal meaning unless definitely defined herein.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof.

The following will now describe aspects of some example embodiments of the present invention in conjunction with the accompanying drawings.

Figure 1B:
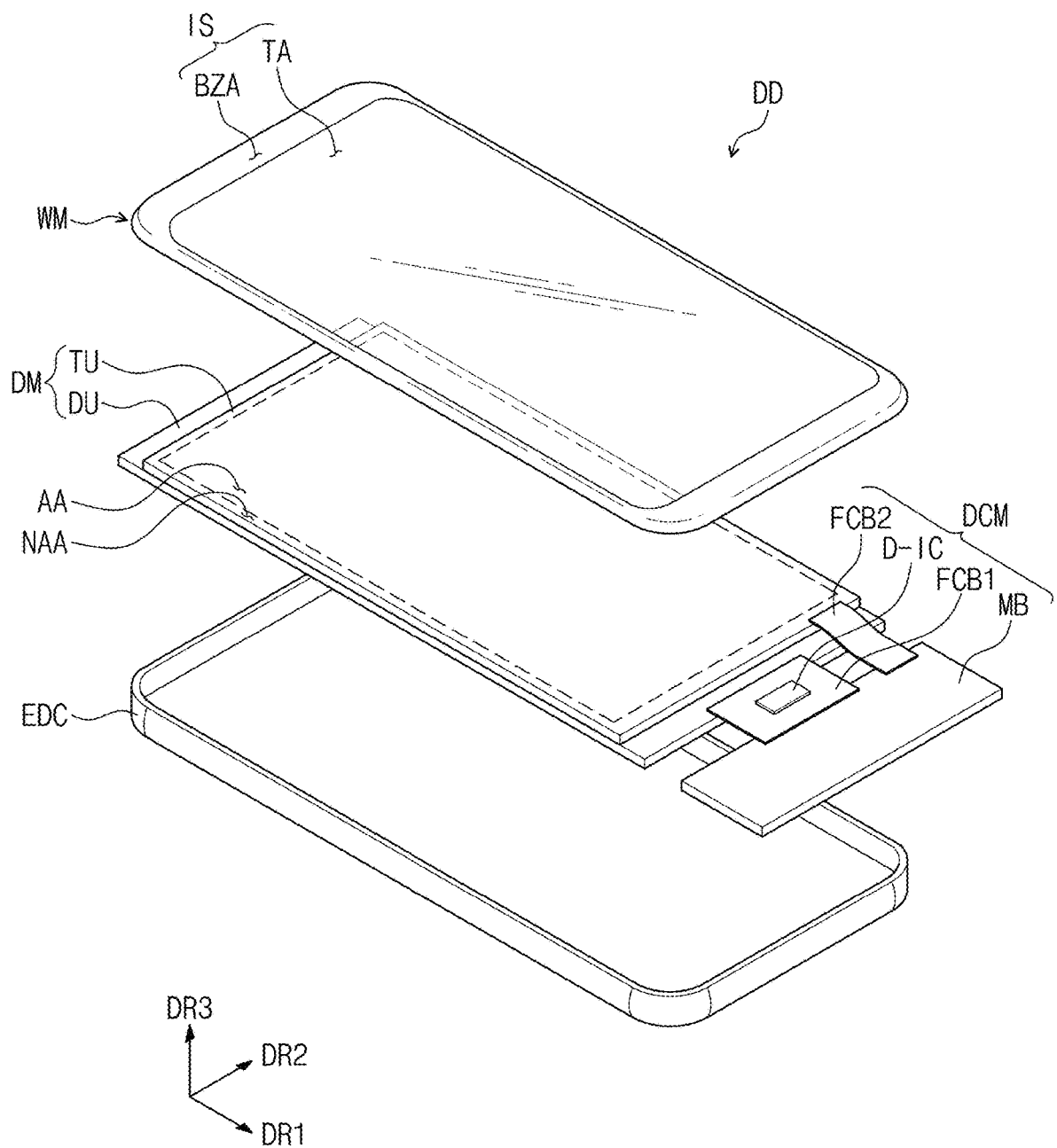
FIG. 1B illustrates an exploded perspective view showing a display device according to some example embodiments of the present invention.

FIG. 1A illustrates an assembled perspective view showing a display device according to some example embodiments of the present invention. FIG. 1B illustrates an exploded perspective view showing a display device according to some example embodiments of the present invention. FIG. 2 illustrates a simplified cross-sectional view showing a display module according to some example embodiments of the present invention.

Referring to FIGS. 1A and 1B, a display device DD may be an apparatus that is activated by an electrical signal. The display device DD may include various embodiments. For example, the display device DD may be used for large-sized electronic apparatuses, such as televisions, monitors, or outdoor billboards, and may also be used for small- and medium-sized electronic apparatuses, such as personal computers, laptop computers, personal digital terminals, automotive navigation units, game consoles, portable electronic devices, or cameras. However, these items are disclosed only an embodiment, and the display device DD may be used for any suitable electronic apparatus that is consistent with the scope and spirit of the present invention. In some embodiments, a smart-phone is illustrated as an example of the display device DD, but embodiments according to the present invention are not limited thereto, and the display device DD may be used for any suitable electronic device or apparatus.

The display device DD may display an image IM in a third direction DR3 on a display surface IS parallel to each of first and second directions DR1 and DR2. The image IM may include not only dynamic (e.g., video) images but also static (e.g., still) images. FIG. 1A shows a clock window and icons as an example of the image IM. The display surface IS where the image IM is displayed may correspond to a front surface of the display device DD and to a front surface of a window WM.

According to some example embodiments, front and rear surfaces (or top and bottom surfaces) of each component are defined based on a direction along which the image IM is displayed. The front and rear surfaces may be opposite to each other in the third direction DR3, and a normal direction to each of the front and rear surfaces may be parallel to the third direction DR3. Directions indicated by the first, second, and third directions DR1, DR2, and DR3 are relative concepts and changed into other directions. In this disclosure, the description "when viewed on a plane" may mean "when viewed in the third direction DR3"

The display device DD may detect an external input TC that is applied from the outside. The external input TC may include any suitable types of input applied from outside the display device DD. The external input TC may be provided in various types.

For example, the external input TC may not only include touch of a user's hand or other body part, but include any input (e.g., hovering touch) that approaches or is in the vicinity of the display device DD. In addition, the external input TC may include force, pressure, light, or any of other external inputs (e.g., a stylus).

The front surface of the display device DD may be divided into a transmission area TA and a bezel area BZA. The transmission area TA may be a region where the image IM is displayed. A user may recognize the image IM through the transmission area TA.

The bezel area BZA may be adjacent to the transmission area TA. The bezel area BZA may have a certain color. The bezel area BZA may surround the transmission area TA. Therefore, the transmission area TA may have a shape substantially defined by the bezel area BZA. However, this is an example, and the bezel area BZA may be located adjacent to only one side of the transmission area TA or may be omitted. An electronic apparatus according to some embodiments of the present invention may include various embodiments, without being limited to a particular embodiment.

The display device DD may include a window WM, a display module DM, and a case EDC. In some example embodiments, the window WM and the case EDC may be combined with each other to constitute an appearance of the display device DD.

The window WM may include an optically transparent insulating material. For example, the window WM may include glass or plastic. The window WM may have a multi-layered or single-layered structure. For example, the window WM may include either a plurality of plastic films that are coupled to each other through an adhesive or a glass substrate with a plastic film coupled thereto through an adhesive.

As discussed above, the front surface of the window WM may define the display surface IM of the display device DD. The transmission area TA may be an optically transparent region. For example, the transmission area TA may be a region having a visible light transmittance equal to or greater than about 90%.

The bezel area BZA may be a region whose transmittance of light is relatively less than that of the transmission area TA. The bezel area BZA may define the shape of the transmission area TA. The bezel area BZA may be adjacent to and may surround the transmission area TA.

The bezel area BZA may have a certain color. The bezel area BZA may cover a peripheral area NAA of the display module DM and may inhibit the peripheral area NAA from being externally visible. This, however, is illustrated as an example, and the bezel area BZA may be omitted from the window WM according to some example embodiments of the present invention.

The display module DM may display the image IM and may detect an external input. The display module DM may be divided into an active area AA and a peripheral area NAA. The active area AA may be a region that is activated by an electric signal.

In some example embodiments, the active area AA may be a region that displays the image IM and also detects an external input. The transmission area TA may overlap at least the active area AA. For example, the transmission area TA may entirely or at least partially overlap the active area AA. Accordingly, a user may recognize the image IM through the transmission area TA or may provide an external input through the transmission area TA. This, however, is illustrated as an example, and the active area AA may be configured such that a region to display the image IM is separated from a region to detect an external input, but embodiments according to present invention are not limited to a particular embodiment.

The peripheral area NAA may be a region covered with the bezel area BZA. The peripheral area NAA may be adjacent to the active area AA. The peripheral area NAA may surround the active area AA. The peripheral area NAA may include driver lines or driver circuits to drive the active area AA.

The case EDC may be combined with the window WM. The case EDC and the window WM may be coupled to each other to provide a certain internal space. The display module DM may be accommodated in the internal space. The case EDC may include a material whose strength is relatively large. For example, the case EDC may include glass, plastic, or metal, or may include a plurality of frames and/or plates made of any combination of glass, plastic, and metal. The case EDC may stably protect, from external impact, components of the display device DD that are accommodated in the internal space.

According to some example embodiments, the display module DM and the case EDC may have therebetween a battery module or the like to provide power required for an overall operation of the display device DD.

Referring to FIG. 2, the display module DM may include a display unit DU and an input detection unit TU. The display unit DU may include a base substrate BS, a display circuit layer CL, a display element layer ED, an encapsulation substrate ECS, and a sealant SM.

The base substrate BS may include a flexible substrate, for example, a plastic substrate, a glass substrate, a metal substrate, or an organic/inorganic composite material substrate. According to some example embodiments of the present invention, the base substrate BS may include at least one plastic film.

The display circuit layer CL may be formed or arranged on the base substrate BS. The display circuit layer CL may include at least one insulating layer and a circuit element. The insulating layer may include at least one inorganic layer and at least one organic layer. The circuit element may include a signal line, a pixel driver circuit, or the like. The display circuit layer CL may be formed by formation processes in which insulating, semiconductor, and conductive layers are coated or deposited, and by patterning processes in which photolithography is used to pattern the insulating, semiconductor, and conductive layers.

The display element layer ED may include an organic light emitting element, a pixel definition layer, and the like. The display element layer ED may be formed or arranged at the active area AA of the display module DM.

The encapsulation substrate ECS may be located opposite to the base substrate BS, thereby covering or encapsulating the display element layer ED to protect the display element layer ED from external contaminants. The sealant SM may be located between the encapsulation substrate ECS and the base substrate BS. The sealant SM may be located on the peripheral area NAA of the display module DM. The sealant SM may combine the encapsulation substrate ECS and the base substrate BS with each other. The sealant SM may be provided in the shape of a closed loop to seal a space between the encapsulation substrate ECS and the base substrate BS.

The input detection unit TU may be directly arranged on the display unit DU. According to some example embodiments, the input detection unit TU may be directly placed on the encapsulation substrate ECS. In this disclosure, the description "directly placed" (or "directly formed", "directly arranged", "directly mounted" or any similar terminology) excludes the meaning that an adhesive layer is used for attachment, but includes the meaning of "formed by a continuous process"

The input detection unit TU may include sensing electrodes each of which includes sensing patterns and sensing lines. The sensing electrodes and the sensing lines may each have a single-layered or multi-layered structure.

Referring back to FIG. 1B, a driver circuit module DCM may be electrically connected to the display module DM. The driver circuit module DCM may include a main circuit board MB, a first flexible circuit board FCB1, and a second flexible circuit board FCB2.

The main circuit board MB may include power supply connectors or various driver circuits to drive the display module DM. The first flexible circuit board FCB1 may be coupled to the main circuit board MB and the display unit DU. The driver circuit module DCM may further include a driver chip D-IC mounted on the first flexible circuit board FCB1. The driver chip D-IC may include a pixel driver element, for example, a data driver circuit. In some example embodiments, the driver chip D-IC may be directly mounted on the display unit DU.

The second flexible circuit board FCB2 may be coupled to the main circuit board MB and the input detection unit TU. FIG. 1B shows a structure where the first and second flexible circuit boards FCB1 and FCB2 are connected to the main circuit board MB, but embodiments according to the present invention are not limited thereto. The driver circuit module DCM may include two main circuit boards that are correspondingly connected to the first and second flexible circuit boards FCB1 and FCB2.

Figure 3:
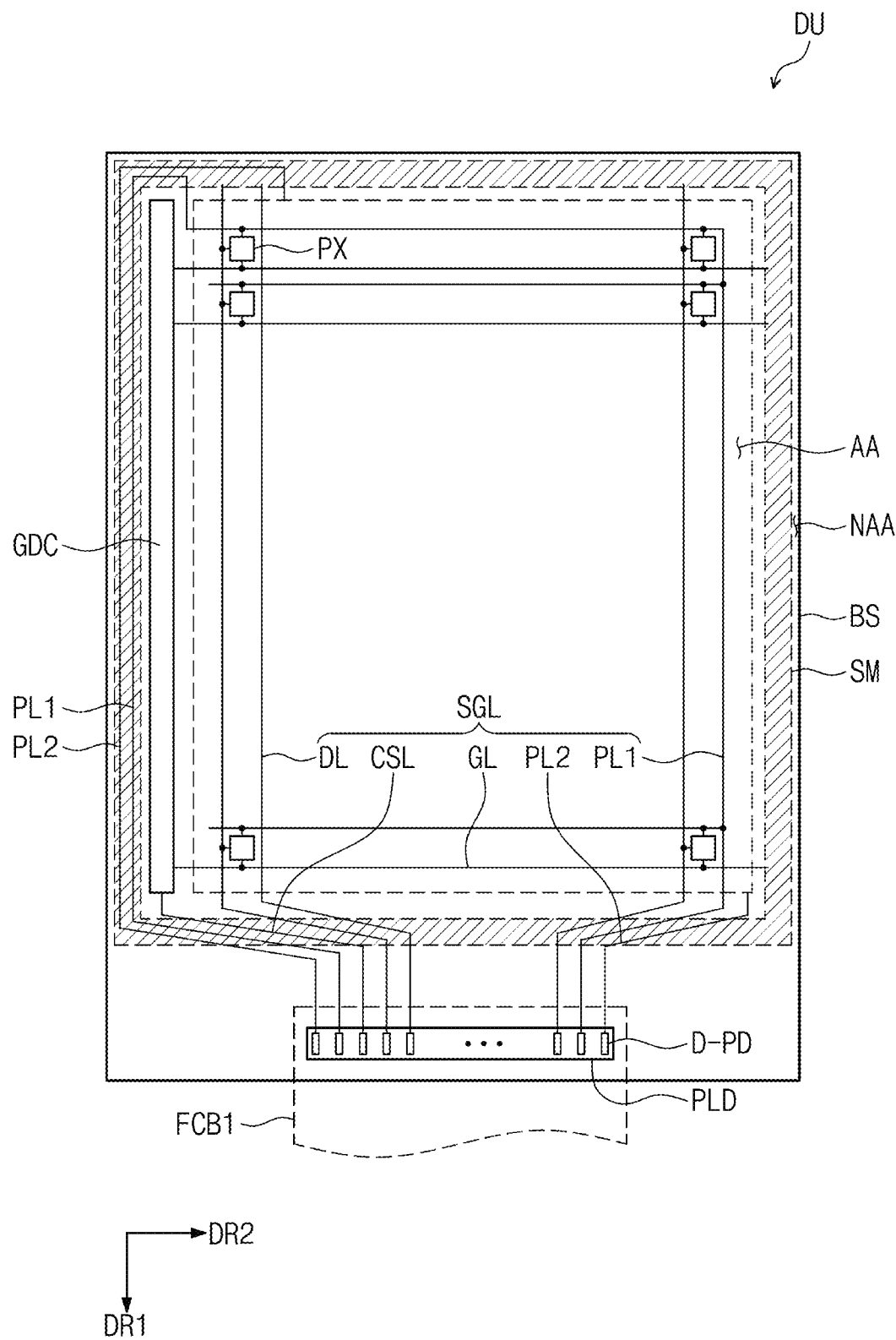
FIG. 3 illustrates a plan view showing a display unit according to some example embodiments of the present invention.

FIG. 3 illustrates a plan view showing a display unit according to some example embodiments of the present invention.

Referring to FIG. 3, the display unit DU may include a driver circuit GDC, a plurality of signal lines SGL, and a plurality of pixels PX. The display unit DU may further include a pixel pad section PLD that is located on the peripheral area NAA and includes pixel pads D-PD connected to corresponding ones of the plurality of signal lines SGL.

The pixels PX may be located on the active area AA. Each of the pixels PX may include an organic light emitting element and a pixel driver circuit connected to the organic light emitting element. The driver circuit GDC, the signal lines SGL, the pixel pad section PLD, and the pixel driver circuit may be included in the display circuit layer CL illustrated in FIG. 2.

The driver circuit GDC may include a gate driver circuit. The gate driver circuit GDC may generate a plurality of gate signals, and may sequentially output the gate signals to a plurality of gate lines GL which will be discussed in more detail below. The gate driver circuit GDC may further output different control signals to the pixel driver circuit.

The signal lines SGL may include gate lines GL, data lines DL, a first power line PL1, a second power line PL2, and a control signal line CSL. One of the gate lines GL may be connected to a corresponding one of the pixels PX, and one of the data lines DL may be connected to a corresponding one of the pixels PX. The first and second power lines PL1 and PL2 may be connected to the pixels PX. The control signal line CSL may provide the gate driver circuit GDC with control signals. The signal lines SGL may overlap the active area AA and the peripheral area NAA.

The pixel pad section PLD may be a location to which the first flexible circuit board FCB1 is connected, and the pixel pads D-PD of the pixel pad section PLD may be connected to corresponding pads of the first flexible circuit board FCB1. Portions of connection lines located on the display circuit layer CL may be exposed by an insulating layer included in the display circuit layer CL, and the exposed portions may correspond to the pixel pads D-PD.

The pixel pads D-PD may be connected through the signal lines SGL to corresponding pixels PX. In addition, one of the pixel pads D-PD may be connected through the control signal line CSL to the gate driver circuit GDC.

The first flexible circuit board FCB1 may be coupled to the pixel pad section PLD of the display unit DU, thereby electrically connecting the display unit DU to the main circuit board (see MB of FIG. 1B). A single first flexible circuit board FCB1 may be provided in some embodiments of the present invention, but in other embodiments, a plurality of first flexible circuit boards FCB1 may be provided coupled to the display unit DU.

The pixel PX may receive a gate signal from the gate line GL and a data signal from the data line DL. In addition, the pixel PX may receive a first power voltage from the first power line PL1 and a second power voltage from the second power line PL2. The pixel PX may include at least one thin film transistor, a capacitor, and an organic light emitting element.

Figure 4:
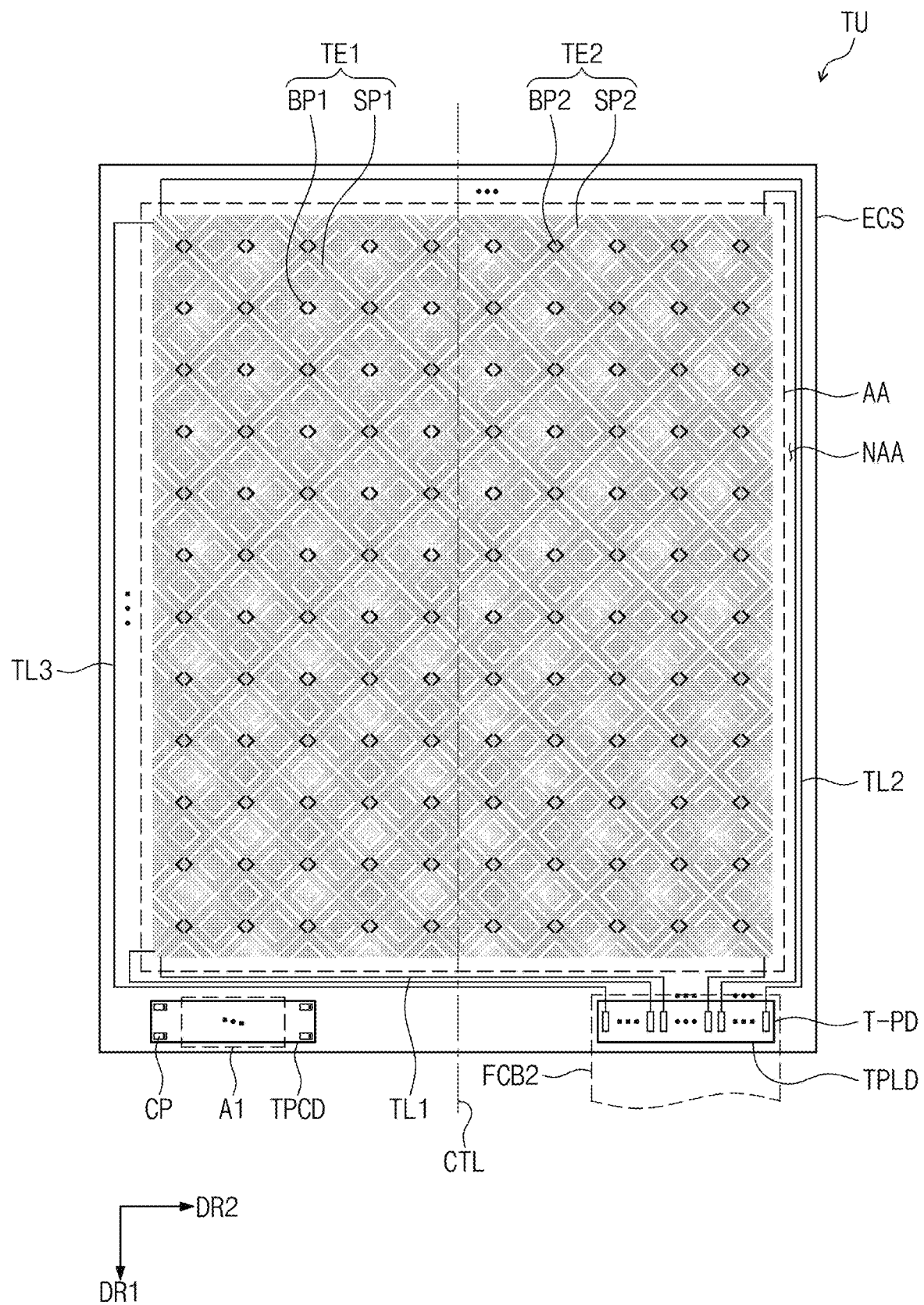
FIG. 4 illustrates a plan view showing an input detection unit according to some example embodiments of the present invention.
Figure 5:
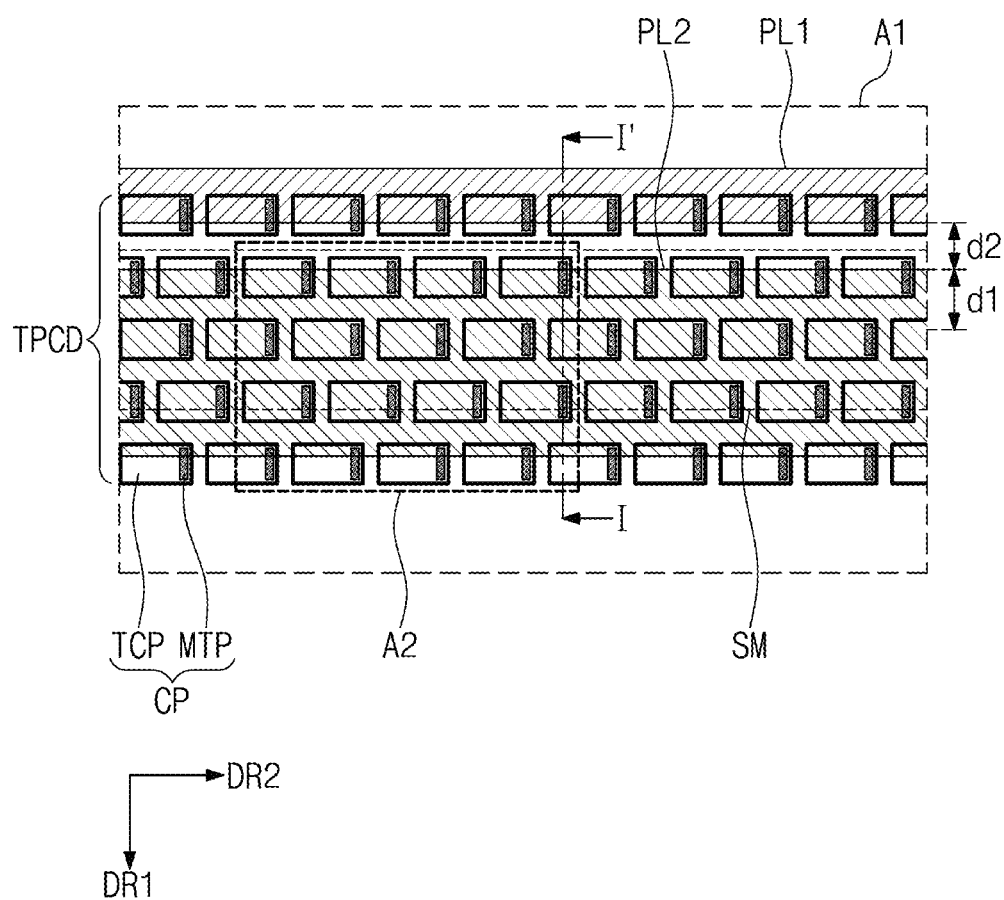
FIG. 5 illustrates an enlarged view showing a section A1 of FIG. 4.
Figure 6:
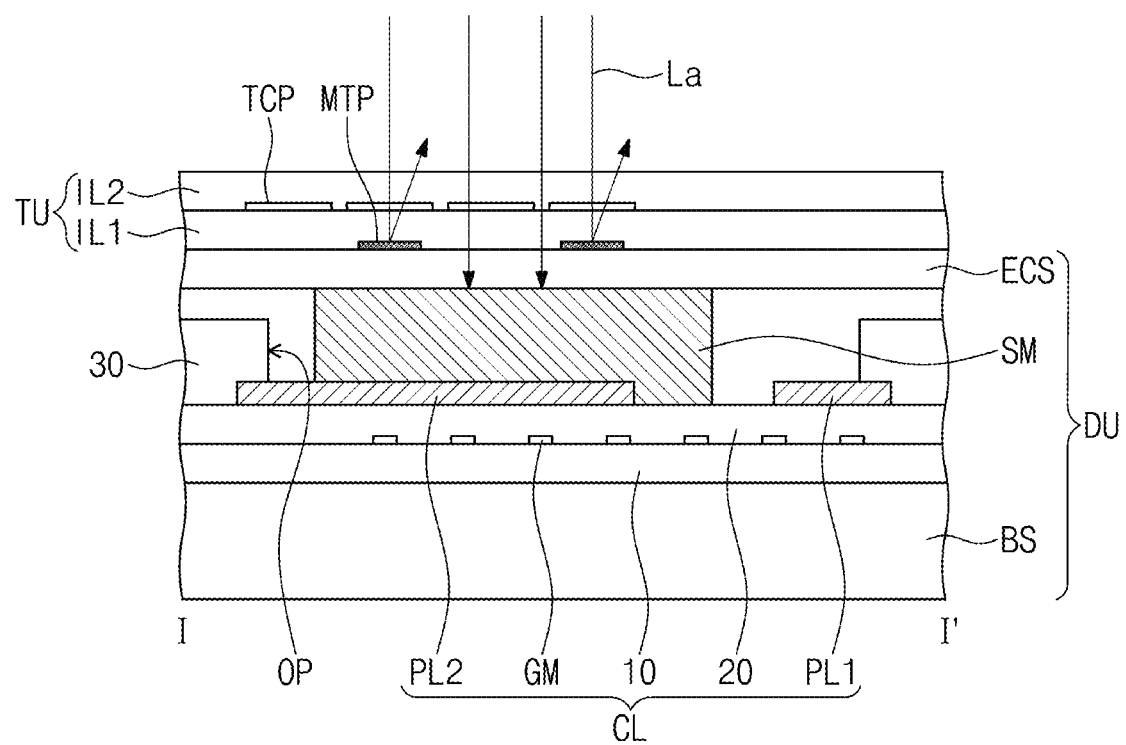
FIG. 6 illustrates a cross-sectional view taken along the line I-I' of FIG. 5.

FIG. 4 illustrates a plan view showing an input detection unit according to some example embodiments of the present invention. FIG. 5 illustrates an enlarged view showing a section A1 of FIG. 4. FIG. 6 illustrates a cross-sectional view taken along the line I-I' of FIG. 5.

Referring to FIGS. 2 and 4, the input detection unit TU according to some example embodiments of the present invention may be directly formed on the display unit DU. For example, the input detection unit TU may be directly placed on the encapsulation substrate ECS.

The input detection unit TU may detect the external input (see TC of FIG. 1A) to obtain information about the position of the external input TC. The input detection unit TU may include a plurality of first sensing electrodes TE1, a plurality of second sensing electrodes TE2, a plurality of sensing lines TL1, TL2, and TL3, and a sensing pad section TPLD.

The first sensing electrodes TE1 and the second sensing electrodes TE2 may be located at the active area AA. The input detection unit TU may obtain information about the external input TC, based on a variation in capacitance between the first sensing electrodes TE1 and the second sensing electrodes TE2.

The first sensing electrodes TE1 may extend along the first direction DR1, and may be arranged along the second direction DR2. Each of the first sensing electrodes TE1 may include first sensing patterns SP1 and first connection patterns BP1.

The first sensing patterns SP1 may be arranged along the first direction DR1. The first sensing patterns SP1 may be arranged to be spaced apart from each other. Each of the first sensing patterns SP1 may have a rhombic shape. This, however, is merely illustrated as an example, and the first sensing patterns SP1 may have various shapes, and the shape thereof is not limited to a particular embodiment.

The first connection patterns BP1 may connect the first sensing patterns SP1 to each other that are arranged to be spaced apart from each other along the first direction DR1. For example, the first connection patterns BP1 may be formed between the first sensing patterns SP, thereby connecting the first sensing patterns SP1 to each other.

The second sensing patterns SP2 may be arranged along the second direction DR2. The second sensing patterns SP2 may be arranged to be spaced apart from each other. In addition, the second sensing patterns SP2 may be spaced apart from the first sensing patterns SP1. Each of the second sensing patterns SP2 may have a rhombic shape. This, however, is merely illustrated as an example, and the second sensing patterns SP2 may have various shapes, and the shape thereof is not limited to a particular embodiment.

The second connection patterns BP2 may connect the second sensing patterns SP2 to each other that are arranged to be spaced apart from each other along the second direction DR2. For example, the second connection patterns BP2 may be located between the second sensing patterns SP2, thereby connecting the second sensing patterns SP2 to each other. The second connection patterns BP2 and the second sensing patterns SP2 may constitute a single unitary shape.

The sensing lines TL1, TL2, and TL3 may be arranged on the peripheral area NAA. The sensing lines TL1, TL2, and TL3 may include first sensing lines TL1, second sensing lines TL2, and third sensing lines TL3.

The first sensing lines TL1 may be connected to corresponding first sensing electrodes TE1. For example, the first sensing lines TL1 may be correspondingly connected to bottom ones of opposite ends of the first sensing electrodes TE1, which bottom ends are relatively closer to the sensing pad section TPLD.

The second sensing lines TL2 may be connected to corresponding first sensing electrodes TE1. For example, the second sensing lines TL2 may be correspondingly connected to top ones of the opposite ends of the first sensing electrodes TE1, which top ends face the bottom ends.

The first sensing electrodes TE1 may be connected to corresponding first sensing lines TL1 and corresponding second sensing lines TL2. Therefore, it may be possible to uniformly maintain sensitivity with respect to the first sensing electrodes TE1 whose lengths are relatively greater than those of the second sensing electrodes TE2. This, however, is merely illustrated as an example, and the second sensing lines TL2 may be omitted from the input detection unit TU according to some example embodiments of the present invention, but embodiments according to the present invention are not limited thereto.

The third sensing lines TL3 may be correspondingly connected to ends of the second sensing electrodes TE2. For example, the third sensing lines TL3 may be correspondingly connected to left ones of opposite ends of the second sensing electrodes TE2.

The sensing pad section TPLD may be located on the peripheral area NAA. The sensing pad section TPLD may be defined to refer to a location to which the second flexible circuit board FCB2 is connected. In this disclosure, the peripheral area NAA may have a partial region that is defined as a pad area where the sensing pad section TPLD is located. The sensing pad section TPLD may include sensing pads T-PD extended from ends of the first to third sensing lines TL1 to TL3. The sensing pads T-PD may be connected through the first to third sensing lines TL1 to TL3 to the first and second sensing electrodes TE1 and TE2.

The sensing pads T-PD of the sensing pad section TPLD may be connected to corresponding pads of the second flexible circuit board FCB2. The second flexible circuit board FCB2 may be coupled to the sensing pad section TPLD of the input detection unit TU, thereby electrically connecting the input detection unit TU to the main circuit board (see MB of FIG. 1B).

The input detection unit TU according to some example embodiments of the present invention may further include a pattern section TPCD arranged on the peripheral area NAA. The pattern section TPCD may be located on the encapsulation substrate ECS, while corresponding to the peripheral area NAA. The pattern section TPCD may include a plurality of conductive patterns CP in a floating state. In this disclosure, the description "floating state" may mean that the conductive patterns CP are formed in island shapes without being electrically connected to other components. The conductive patterns CP may be electrically connected to none of the first and second sensing electrodes TE1 and TE2 and the first, second, and third sensing lines TL1, TL2, and TL3.

As shown in FIG. 4, a position of the pattern section TPCD and a position of the sensing pad section TPLD may be symmetrical to each other about a central line CTL that passes in the first direction DR1 through a center of the input detection unit TU.

Referring to FIGS. 5 and 6, the pattern section TPCD may overlap the first and second power lines PL1 and PL2 included in the display unit DU. The first and second power lines PL1 and PL2 may overlap the sealant SM. For example, on a location where the pattern section TPCD is located, the sealant SM may overlap the second power line PL2.

In some example embodiments, the pattern section TPCD may be arranged to partially overlap the first and second power lines PL1 and PL2 and the sealant SM.

On a location where the pattern section TPCD and the sealant SM overlap each other, a distance d1 (also referred to as a first interval) between an end of the second power line PL2 and a center of the sealant SM may have a value within a reference range (e.g., a set or predetermined reference range). For example, the reference range may be from about 110 μm to about 220 μm. In addition, on a location where the pattern section TPCD is formed, the first power line PL1 and the second power line PL2 may be spaced apart from each other at a second interval d2. The second interval d2 may be less than the first interval d1. For example, the second interval d2 may be about 50 μm.

The plurality of conductive patterns CP may be arranged along the first direction DR1 and the second direction DR2. For example, the plurality of conductive patterns CP may be arranged in a zigzag fashion in the first direction DR1.

Each of the conductive patterns CP may include a transparent conductive pattern TCP that includes a transparent conductive material and a metal pattern MTP that includes a metallic material. The metal pattern MTP may be positioned on one side of the transparent conductive pattern TCP.

As shown in FIGS. 5 and 6, the metal pattern MTP may be formed on the encapsulation substrate ECS. The metal pattern MTP may include a metallic material, such as aluminum, copper, or molybdenum. The metal pattern MTP and the first, second, and third sensing lines TL1, TL2, and TL3 may be formed simultaneously with each other in the same process.

The input detection unit TU may include a first insulating layer IL1 that covers the metal pattern MTP. The first insulating layer IL1 may include an inorganic material. The transparent conductive pattern TCP may be formed on the first insulating layer IL1. The transparent conductive pattern TCP may include a transparent conductive material, such as indium tin oxide or indium zinc oxide. The transparent conductive pattern TCP and the first and second sensing electrodes TE1 and TE2 may be formed simultaneously with each other in the same process. The transparent conductive pattern TCP may be covered with a second insulating layer IL2.

In some example embodiments, the input detection unit TU may further include a barrier layer between the encapsulation substrate ECS and the metal pattern MTP, and may also include a protective layer formed on the second insulating layer IL2.

The display circuit layer CL of the display unit DU may include a first intermediate insulating layer 10, a second intermediate insulating layer 20, and signal lines (see SGL of FIG. 3). The first intermediate insulating layer 10 may be provided thereon with first signal lines GM of the signal lines SGL, which first signal lines GM are formed of gate metal. The first signal lines GM may include connection lines that connect the data line (see DL of FIG. 2) to the pixel pads (see D-PD of FIG. 3) on the peripheral area NAA, and may also include gate lines GL located at the active area AA. The first signal lines GM may partially overlap the first and second power lines PL1 and PL2.

The first signal lines GM may be covered with the second intermediate insulating layer 20. The second intermediate insulating layer 20 may be provided thereon with second signal lines formed of source/drain metal. The second signal lines may include the first and second power lines PL1 and PL2.

An organic layer 30 may be located on the display circuit layer CL. The organic layer 30 may be either a pixel definition layer of the display element layer ED or an encapsulation layer that covers the display element layer ED. The organic layer 30 may have an opening OP that is formed along the sealant SM. The opening OP of the organic layer 30 may partially expose the first and second power lines PL1 and PL2. The opening OP of the organic layer 30 may overlap the pattern section TPCD.

The sealant SM may be formed between the encapsulation substrate ECS and the base substrate BS. For example, the sealant SM may be arranged to correspond to the opening OP. The sealant SM may be provided in the form of molten frit including glass powder. When the sealant SM is formed between the encapsulation substrate ECS and the base substrate BS, a laser La may be irradiated to the sealant SM. A portion of the sealant SM may be melted due to energy of the laser La, and therefore the sealant SM and the encapsulation substrate ECS may be joined with each other.

The laser La irradiated from the outside may pass through the input detection unit TU and then may be supplied to the sealant SM. For example, on a location where the pattern section TPCD is formed, the laser La may be supplied to the sealant SM after passing through the transparent conductive pattern TCP, or may be reflected from the metal pattern MTP. Therefore, a transmittance of the laser La may be less at a location where the pattern section TPCD is located than at a location where the pattern section TPCD is not located.

The transmittance of the laser La at the location where the pattern section TPCD is located may decrease within a range in which there is no reduction in cohesive force between the sealant SM and the encapsulation substrate ECS. In the case where the pattern section TPCD causes the reduction in transmittance of the laser La, it may be possible to prevent or reduce defects such as short-circuit occurring when some lines (e.g., the first and second power lines PL1 and PL2) in the display unit DU are melted and connected due to heat generated from the laser La.

Moreover, because the opening OP of the organic layer 30 is formed along the sealant SM, gas discharge from the organic layer 30 due to heat produced in the laser irradiation process may be prevented or reduced. For example, because the pattern section TPCD is formed on a location where the sealant SM overlaps the first and second power lines PL1 and PL2 that are exposed to the opening OP of the organic layer 30, it may be possible to avoid defects in which the first and second power lines PL1 and PL2 are short-circuited due to heat caused by the laser La.

Figure 7A:
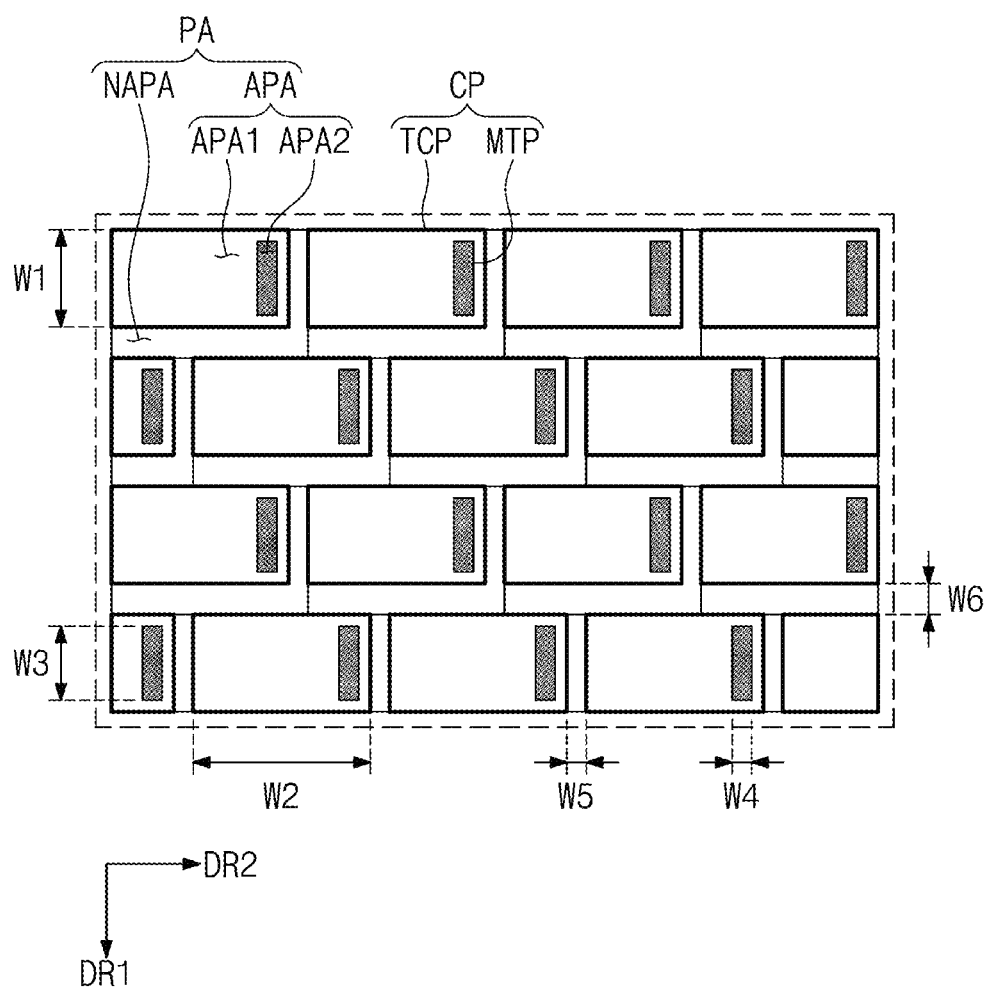
FIG. 7A illustrates an enlarged view showing a section A2 of FIG. 5.
Figure 7B:
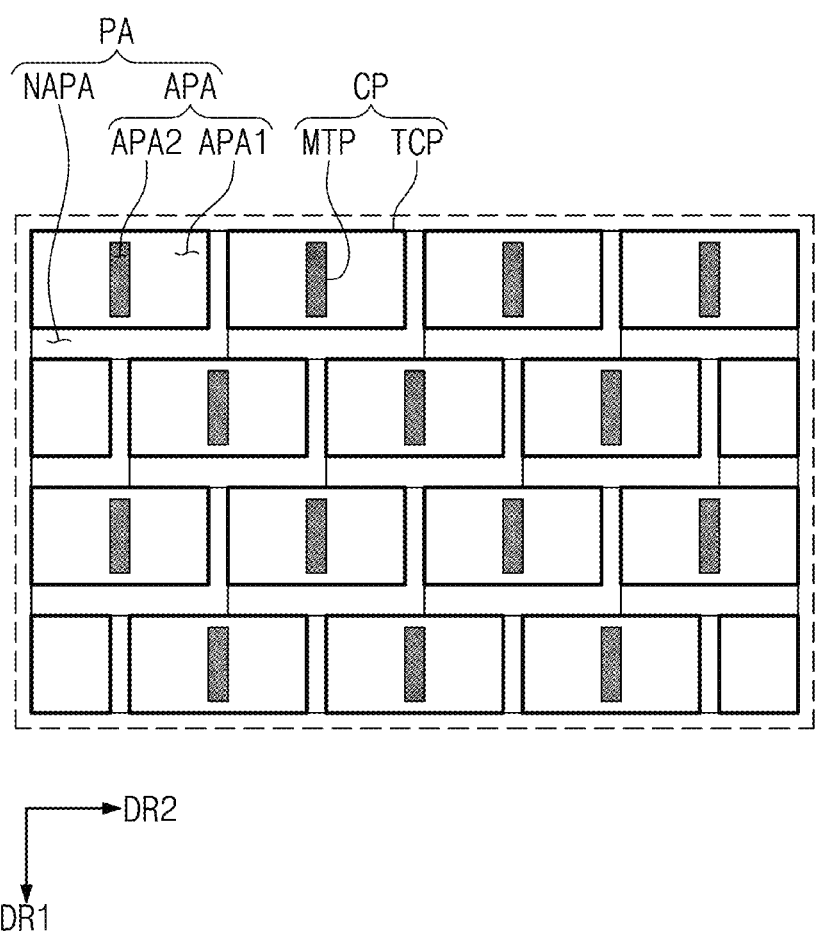
FIG. 7B illustrates an enlarged view showing the section A2 according to some example embodiments of the present invention.
Figure 7C:
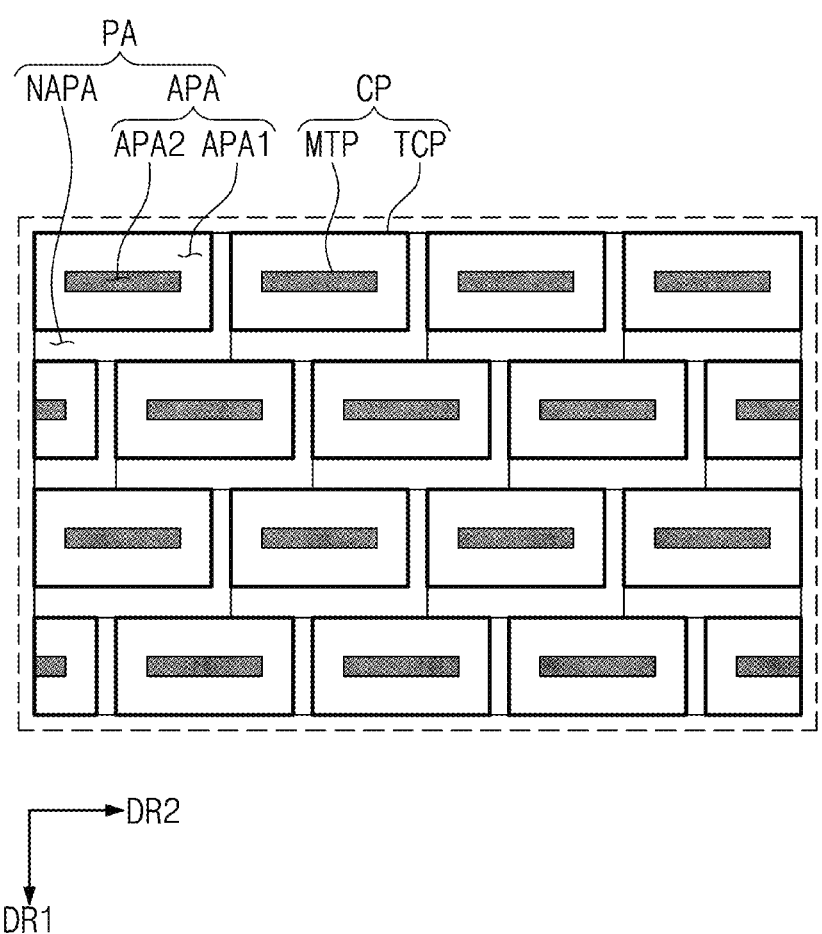
FIG. 7C illustrates an enlarged view showing the section A2 according to some example embodiments of the present invention.
Figure 7D:
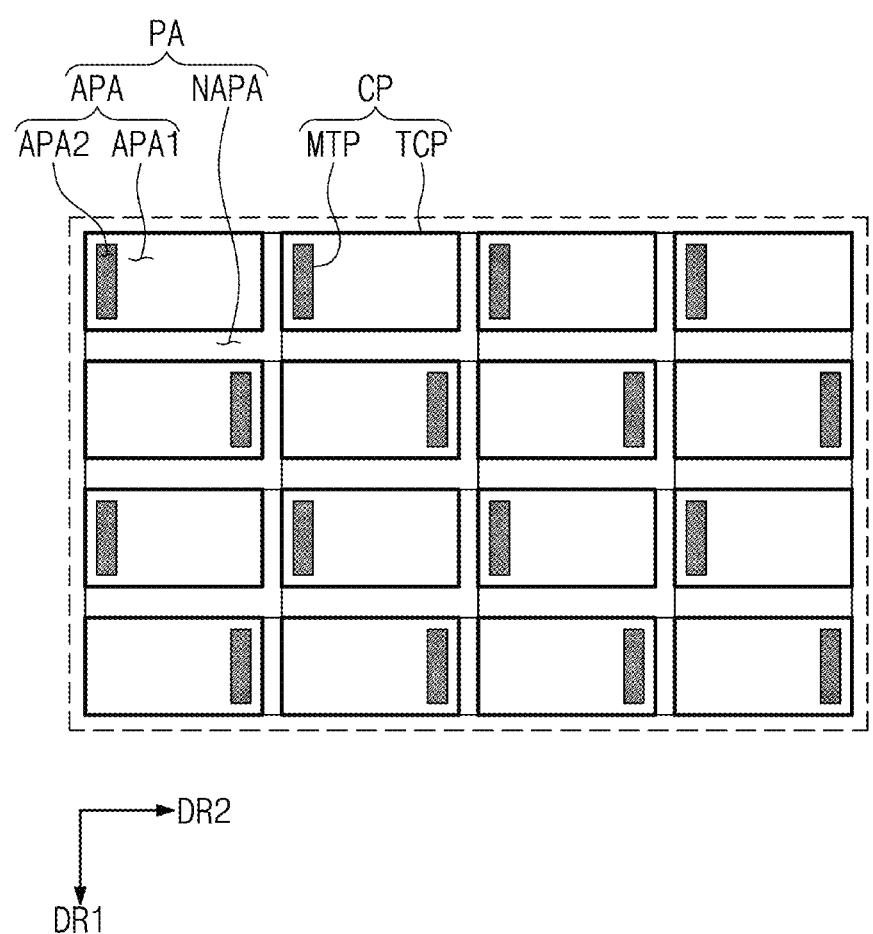
FIG. 7D illustrates an enlarged view showing the section A2 according to some example embodiments of the present invention.

FIG. 7A illustrates an enlarged view showing a section A2 of FIG. 5. FIG. 7B illustrates an enlarged view showing the section A2 according to some example embodiments of the present invention. FIG. 7C illustrates an enlarged view showing the section A2 according to some example embodiments of the present invention. FIG. 7D illustrates an enlarged view showing the section A2 according to some example embodiments of the present invention.

Referring to FIGS. 5 and 7A to 7D, the pattern section TPCD may be divided into pattern regions PA that correspond to the conductive patterns CP, respectively. Each of the pattern regions PA may include an effective pattern region APA and an ineffective pattern region NAPA. The effective pattern region APA may be defined to refer to a region where a corresponding conductive pattern CP is located, and on each pattern region PA, the ineffective pattern region NAPA may be defined to refer to a residual region where the corresponding conductive pattern CP is not located. In some example embodiments, the effective pattern region APA may have an area greater than that of the ineffective pattern region NAPA.

The effective pattern region APA may include a first effective pattern region APA1 and a second effective pattern region APA2. The first effective pattern region APA1 may be defined to refer to a region where the transparent conductive pattern TCP is located, and the second effective pattern region APA2 may be defined to refer to a region where the metal pattern MTP is located. In some example embodiments, the first effective pattern region APA1 may have an area greater than that of the second effective pattern region APA2.

The conductive patterns CP may be arranged in the first and second directions DR1 and DR2. The conductive patterns CP may be arranged in a zigzag fashion in the first direction DR1. The transparent conductive pattern TCP may have a tetragonal shape. Embodiments according to the present invention, however, are not limited thereto. For example, the transparent conductive pattern TCP may have a polygonal shape, a circular shape, or any other shape. In some example embodiments, as shown in FIG. 7A, the transparent conductive pattern TCP may have a rectangular shape elongated in the second direction DR2. The transparent conductive pattern TCP may have a vertical width W1 (also referred to as a first width) in the first direction DR1 and a horizontal width W2 (also referred to as a second width) in the second direction DR2, and the first width W1 may be less than the second width W2. In some example embodiments, the first width W1 may be about 36 μm, and the second width W2 may be about 40 μm.

The metal pattern MTP may overlap one side of the transparent conductive pattern TCP. FIG. 7A shows a structure where the metal pattern MTP is positioned adjacent to a right side of the transparent conductive pattern TCP, but the position of the metal pattern MTP is not limited thereto. For example, as shown in FIG. 7B or 7C, the metal pattern MTP may be positioned on a central portion of the transparent conductive pattern TCP.

In some example embodiments, the metal pattern MTP may have a tetragonal shape. The shape of the metal pattern MTP, however, is not limited thereto. For example, the metal pattern MTP may have a polygonal shape, a circular shape, or any other shape. In some example embodiments, as shown in FIG. 7A, the metal pattern MTP may have a rectangular shape elongated in the first direction DR1. The metal pattern MTP may have a vertical width W3 (also referred to as a third width) in the first direction DR1 and a horizontal width W4 (also referred to as a fourth width) in the second direction DR2, and the third width W3 may be greater than the fourth width W4. In some example embodiments, the third width W3 may be about 20 μm, and the fourth width W4 may be about 6 μm.

The transparent conductive pattern TCP may be arranged to be spaced apart from other transparent conductive pattern TCP on an adjacent pattern region PA. For example, two transparent conductive patterns TCP adjacent in the second direction DR2 may be arranged to be spaced apart from each other, and two transparent conductive patterns TCP adjacent in the first direction DR1 may be arranged to be spaced apart from each other. The ineffective pattern region NAPA may include a location where two transparent conductive patterns TCP are formed to be spaced apart from each other in the second direction DR2, and may also include a location where two transparent conductive patterns TCP are formed to be spaced apart from each other in the first direction DR1. The ineffective pattern region NAPA may have a fifth width W5 in the second direction DR2 and a sixth width W6 in the first direction DR1. The fifth and sixth widths W5 and W6 may be the same as or different from each other.

In some example embodiments, as shown in FIG. 7C, the metal pattern MTP may have a rectangular shape elongated in the second direction DR2. The metal pattern MTP may be located on a central portion of the transparent conductive pattern TCP As shown in FIGS. 5 and 7D, the transparent conductive patterns TCP may be arranged to be aligned with each other in the first and second directions DR1 and DR2. The metal patterns MTP may be arranged to overlap the transparent conductive patterns TCP. The metal patterns MTP may be arranged in a zigzag fashion in the first direction DR1. For example, on a first row, the metal patterns MTP may be arranged adjacent to corresponding left sides of the transparent conductive patterns TCP. On a second row, the metal patterns MTP may be arranged adjacent to corresponding right sides of the transparent conductive patterns TCP.

In some example embodiments, an area ratio of the second effective pattern region APA2 to the pattern region PA may range from about 5% to about 10%. The area ratio of the second effective pattern region APA2 may have a value that is changed based on a distance (e.g., the first interval d1 of FIG) between the end of the second power line PL2 and the center of the sealant SM. In some embodiments, the smaller the first interval d1, the larger the area ratio of the second effective pattern region APA2, and the larger the first interval d1, the smaller the area ratio of the second effective pattern region APA2. For example, when the first interval d1 is about 117 μm, the area ratio of the second effective pattern region APA2 may be set to about 7%. For another example, when the first interval d1 is about 167 μm, the area ratio of the second effective pattern region APA2 may be set to about 6%. For another example, when the first interval d1 is about 217 μm, the area ratio of the second effective pattern region APA2 may be set to about 5%. The area ratio and the first interval d1 are not limited to the values mentioned above.

The larger the area ratio of the second effective pattern region APA2, the lower the transmittance of the laser (see La of FIG. 6) at the pattern section TPCD, which may result in a reduction in melting efficiency of the sealant SM arranged below the pattern section TPCD. The reduction in melting efficiency of the sealant SM may decrease the cohesive force between the sealant SM and the encapsulation substrate ECS. Therefore, according to some example embodiments, the area ratio of the second effective pattern region APA2 may be set to control the transmittance of the laser La within a range in which there is no reduction in cohesive force between the sealant SM and the encapsulation substrate ECS.

In addition, because the metal patterns MTP for the reflection of the laser La are formed in a zigzag fashion or pattern, a laser reflection effect may be uniformly obtained on the entirety of the pattern section TPCD. Therefore, the laser reflection effect may be concentrated only on a specific region, with the result that, on the specific region, it may be possible to prevent the reduction in cohesive force between the sealant SM and the encapsulation substrate ECS.

Figure 8:
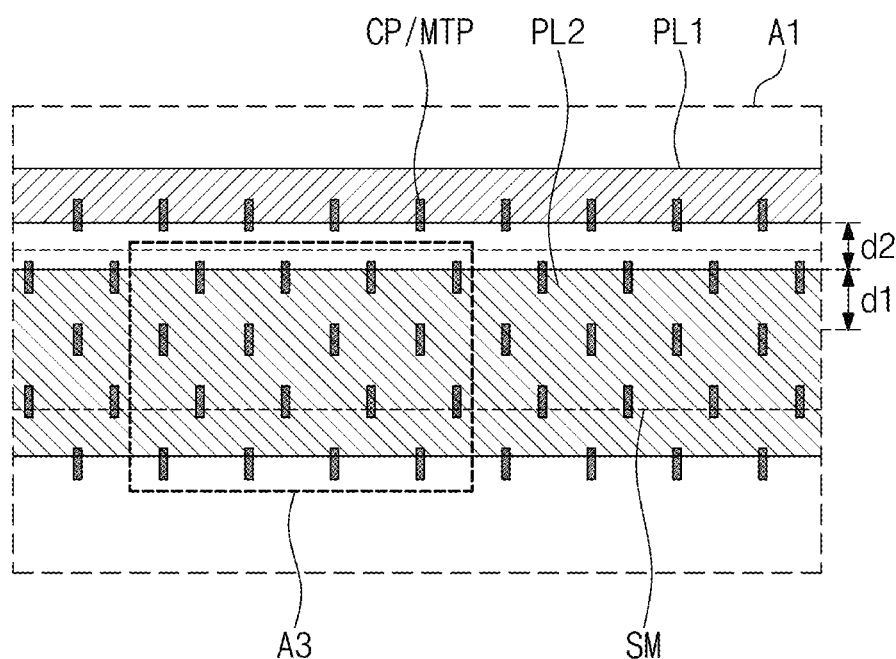
FIG. 8 illustrates an enlarged view showing the section A1 according to some example embodiments of the present invention.
Figure 9A:
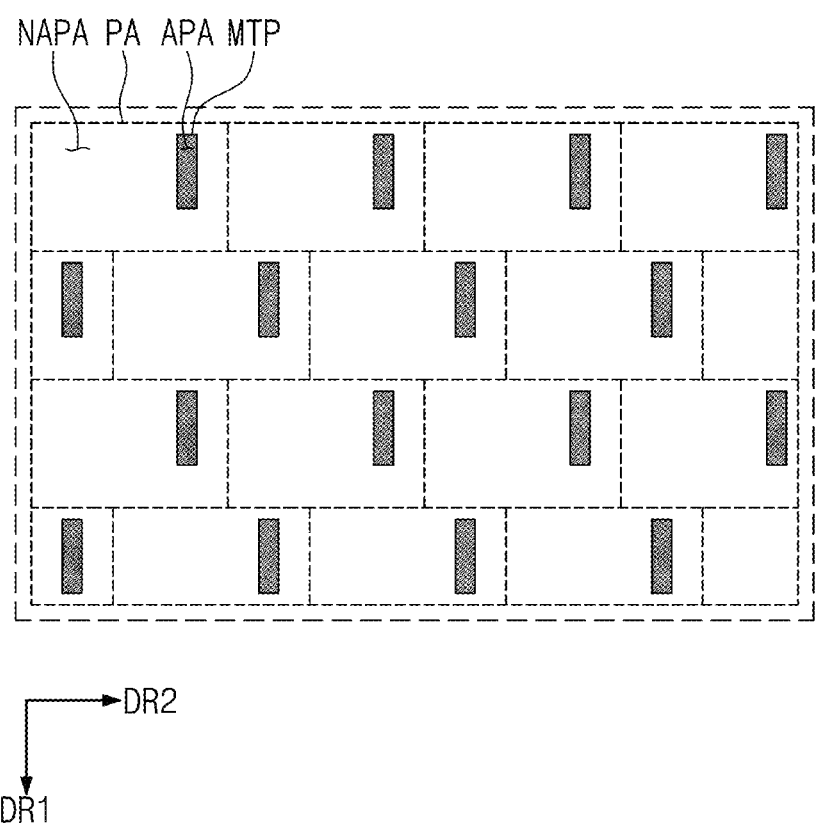
FIG. 9A illustrates an enlarged view showing a section A3 of FIG. 8.
Figure 9B:
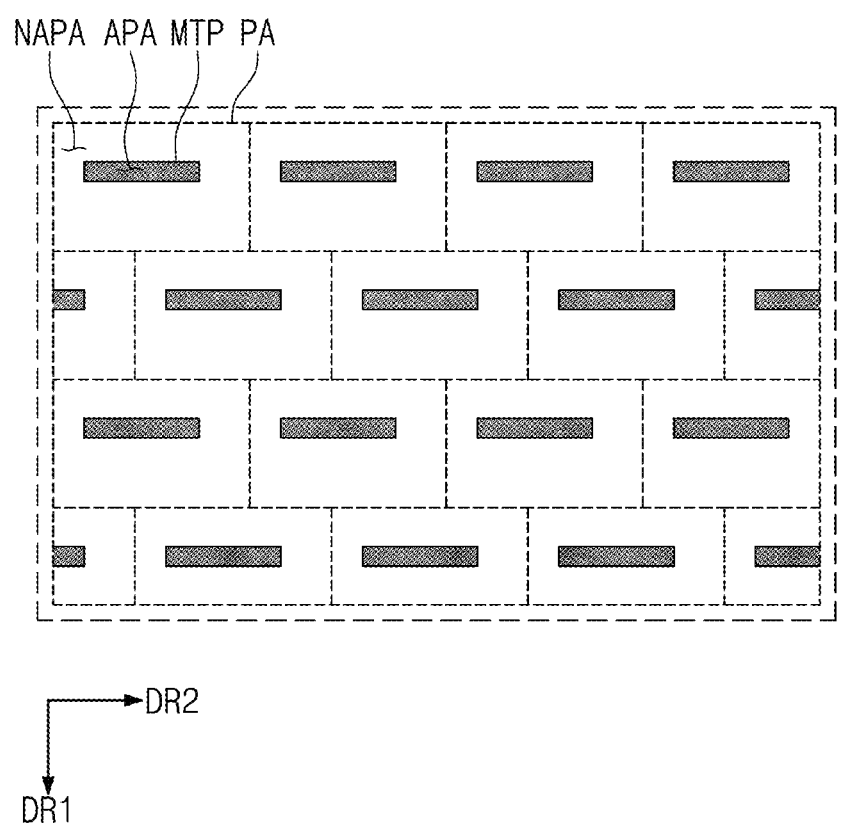
FIG. 9B illustrates an enlarged view showing the section A3 according to some example embodiments of the present invention.

FIG. 8 illustrates an enlarged view showing the section A1 according to some example embodiments of the present invention. FIG. 9A illustrates an enlarged view showing a section A3 of FIG. 8. FIG. 9B illustrates an enlarged view showing the section A3 according to some example embodiments of the present invention. In the embodiment shown in FIG. 8, the same components as those illustrated in FIG. 5 are allocated the same reference symbols, and detailed descriptions thereof will be omitted.

Referring to FIGS. 8 to 9B, the pattern section TPCD may include the conductive patterns CP. The conductive patterns CP may be the metal patterns MTP formed of a metallic material. The pattern section TPCD may be divided into a plurality of pattern regions PA. Each of the pattern regions PA may include an effective pattern region APA and an ineffective pattern region NAPA. The effective pattern region APA may be defined to refer to a region where a corresponding metal pattern MTP is located, and on each pattern region PA, the ineffective pattern region NAPA may be defined to refer to a residual region where the metal pattern MTP is not located. The effective pattern region APA may have an area less than that of the ineffective pattern region NAPA. In some example embodiments, an area ratio of the effective pattern region APA to the pattern region PA may be set to about 9.6%.

The metal patterns MTP may be arranged in the first and second directions DR1 and DR2. In some example embodiments, the metal patterns MTP may be arranged in a zigzag fashion in the first direction DR1. Embodiments according to the present invention, however, are not limited thereto. For example, the metal patterns MTP may arranged in a zigzag fashion in both the first and second directions DR1 and DR2.

In some example embodiments, the metal pattern MTP may have a tetragonal shape. The shape of the metal pattern MTP, however, is not limited thereto. For example, the metal pattern MTP may have a polygonal shape, a circular shape, or any other shape. In some example embodiments, as shown in FIG. 9A, the metal pattern MTP may have a rectangular shape elongated in the first direction DR1.

The metal pattern MTP may be arranged adjacent to one side of the pattern region PA. FIG. 9A shows a structure where the metal pattern MTP is positioned adjacent to a right side of the pattern region PA, but the position of the metal pattern MTP is not limited thereto. For example, the metal pattern MTP may be located at a central portion of the pattern region PA.

In some embodiments, as shown in FIG. 9B, the metal pattern MTP may have a rectangular shape elongated in the second direction DR2. The metal pattern MTP may be positioned on a central portion of the pattern region PA, and the metal patterns MTP may be arranged in a zigzag fashion in the first direction DR1.

Figure 10:
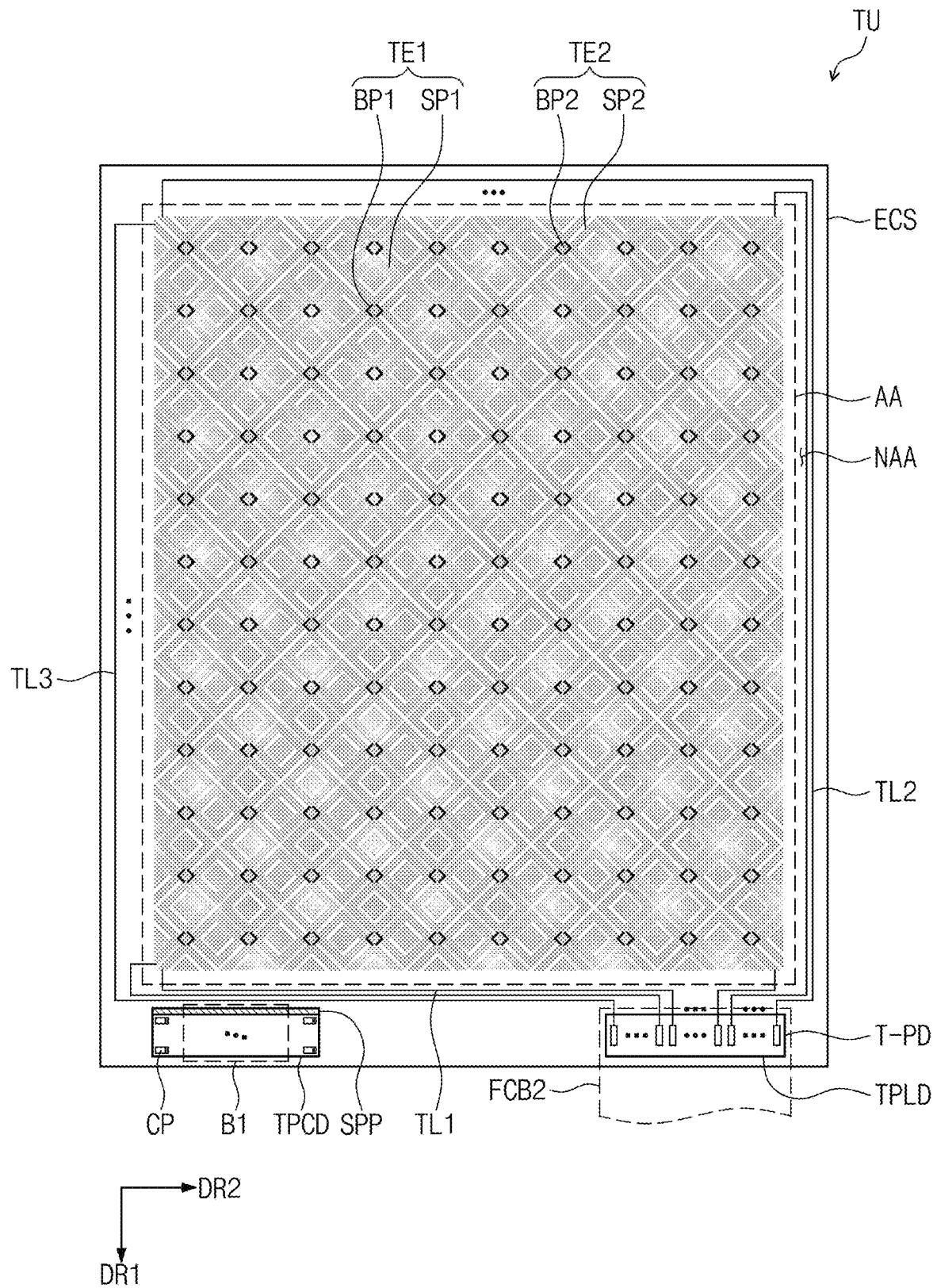
FIG. 10 illustrates a plan view showing an input detection unit according to some example embodiments of the present invention.
Figure 11:
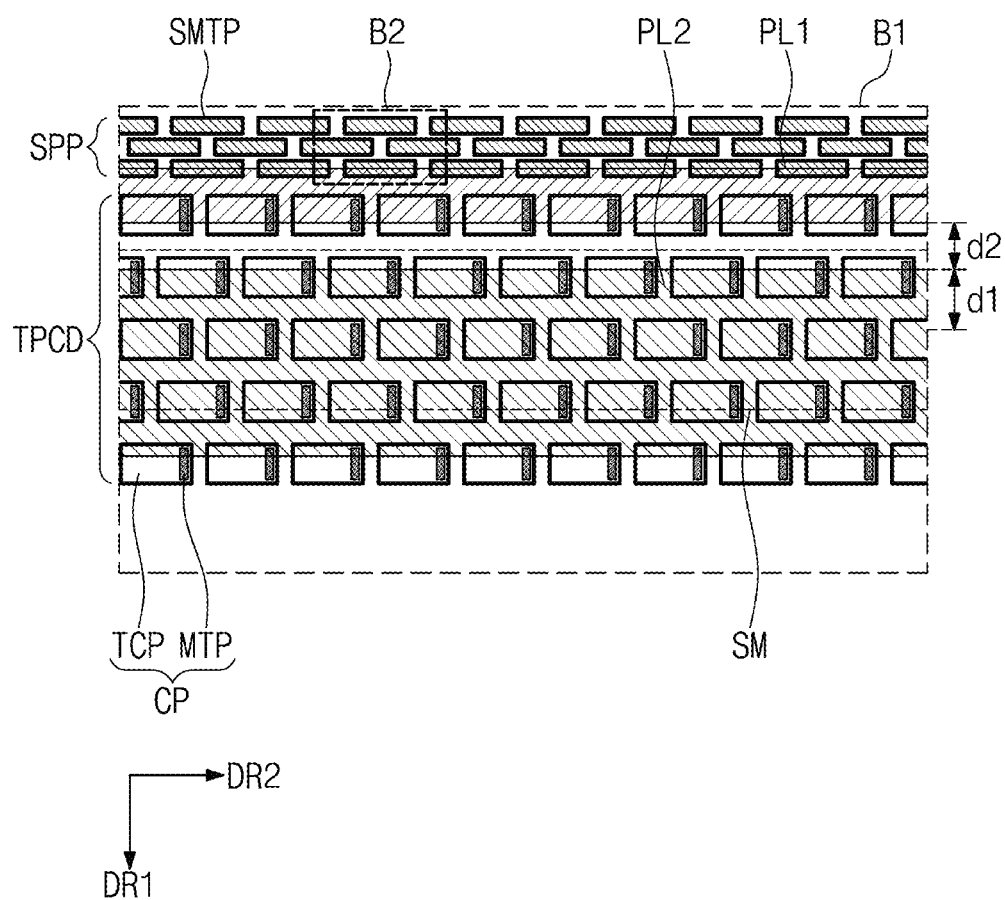
FIG. 11 illustrates an enlarged view showing a section B1 of FIG. 10.
Figure 12:
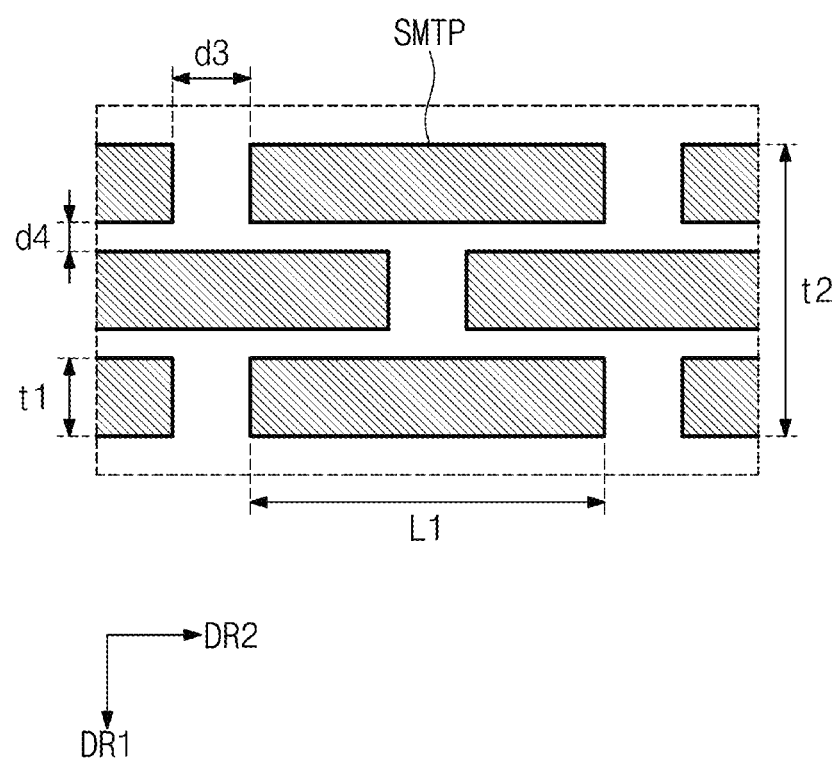
FIG. 12 illustrates an enlarged view showing a section B2 of FIG. 11.

FIG. 10 illustrates a plan view showing an input detection unit according to some example embodiments of the present invention. FIG. 11 illustrates an enlarged view showing section B1 of FIG. 10. FIG. 12 illustrates an enlarged view showing section B2 of FIG. 11.

Referring to FIGS. 10 to 12, the input detection unit TU according to some example embodiments of the present invention may further include an electrostatic shield section SPP arranged at the peripheral area NAA. The electrostatic shield section SPP may be located between the pattern section TPCD and the first and second sensing electrodes TE1 and TE2. The electrostatic shield section SPP may prevent or reduce the first and second sensing electrodes TE1 and TE2 from receiving electrostatic charges that can be externally introduced through the pattern section TPCD.

The electrostatic shield section SPP may include a plurality of electrostatic shield patterns SMTP located between the conductive pattern CP and the first and second sensing electrodes TE1 and TE2.

Each of the plurality of electrostatic shield patterns SMTP may include a metallic material. Therefore, the plurality of electrostatic shield patterns SMTP may be located on the same layer (e.g., the encapsulation substrate ECS of FIG. 6) on which the metal pattern MTP is located. The plurality of electrostatic shield patterns SMTP and the metal pattern MTP may be formed simultaneously with each other in the same process.

The electrostatic shield patterns SMTP may be located on the encapsulation substrate ECS, while corresponding to the peripheral area NAA. The electrostatic shield patterns SMTP may have a floating state. In this disclosure, the description "floating state" may mean that the electrostatic shield patterns SMTP are formed in island shapes without being electrically connected to other members.

As shown in FIG. 11, the electrostatic shield patterns SMTP may be arranged at a location that does not overlap the sealant SM. When the electrostatic shield patterns SMTP are arranged at a location that overlaps the sealant SM, the electrostatic shield patterns SMTP may decrease the transmittance of the laser (see La of FIG. 6). Accordingly, because the electrostatic shield patterns SMTP do not overlap the sealant SM, an electrostatic shield effect may be achieved without affecting the cohesive force between the sealant SM and the encapsulation substrate ECS.

Referring to FIGS. 11 and 12, the electrostatic shield patterns SMTP may be arranged in the first and second directions DR1 and DR2. The electrostatic shield patterns SMTP may be arranged in a zigzag fashion or pattern in the first direction DR1. Each of the electrostatic shield patterns SMTP may have a tetragonal shape. Embodiments according to the present invention, however, are not limited thereto. For example, the electrostatic shield patterns SMTP may each have a polygonal shape, a circular shape, or any other shape. In some example embodiments, the electrostatic shield patterns SMTP may each have a rectangular shape elongated in the second direction DR2. The electrostatic shield patterns SMTP may each have a vertical width t1 (also referred to as a first width) in the first direction DR1 and a horizontal width L1 (also referred to as a second width) in the second direction DR2, and the first width t1 may be less than the second width L1. In some example embodiments, the first width t1 may be about 7 μm, and the second width L1 may be about 30 μm.

The electrostatic shield patterns SMTP may be arranged to be spaced apart from each other in the first and second directions DR1 and DR2. For example, two electrostatic shield patterns SMTP adjacent in the second direction DR2 may be spaced apart from each other at a third interval d3, and two electrostatic shield patterns SMTP adjacent in the first direction DR1 may be spaced apart from each other at a fourth interval d4. The third interval d3 and the fourth interval d4 may be the same as or different from each other. In some example embodiments, the electrostatic shield section SPP may have a total width t2 of about 29 μm in the first direction DR1.

In a display device according to some example embodiments of the present invention, an input detection unit may include a pattern section that corresponds to a location where a sealant overlaps first and second power lines of a display unit. In a laser irradiation process for melting the sealant, the pattern section may reduce a laser transmittance within a range in which there is no reduction cohesive force between the sealant and an encapsulation substrate.

Accordingly, it may be possible to prevent or reduce defects such as short-circuit occurring when some lines in the display unit are melted and connected due to heat generated from the laser.

Although the example embodiments have been described with reference to a number of illustrative examples thereof, it will be understood by those of ordinary skill in the art that various changes in form and details may be made without departing from the spirit and scope of the present invention as set forth in the following claims and their equivalents. Thus, the technical scope of the present invention is not limited by the embodiments and examples described above, but by the following claims and their equivalents.

What is claimed is:

1. A display device, comprising:
a display unit including an active area to display an image and a peripheral area adjacent to the active area, the display unit comprising a pixel corresponding to the active area, a first power line configured to supply the pixel with a first power, and a second power line configured to supply the pixel with a second power; and
an input detection unit on the display unit,
wherein the input detection unit comprises:
a sensing electrode on the display unit and corresponding to the active area;
a sensing pad section on the display unit and corresponding to the peripheral area, the sensing pad section comprising a plurality of sensing pads electrically connected to the sensing electrode; and
a pattern section on the display unit and corresponding to the peripheral area, the pattern section comprising a plurality of conductive patterns partially overlapping the second power line.

2. The display device of claim 1, wherein each of the conductive patterns comprises:
a transparent conductive pattern comprising a transparent conductive material; and
a metal pattern comprising a metallic material.

3. The display device of claim 2, wherein the pattern section is divided into a plurality of pattern regions that correspond to corresponding ones of the conductive patterns,
wherein each of the pattern regions comprises:
an effective pattern region where a corresponding one of the conductive patterns is located; and
an ineffective pattern region where the conductive patterns are not located.

4. The display device of claim 3, wherein an area of the effective pattern region is greater than an area of the ineffective pattern region.

5. The display device of claim 4, wherein the effective pattern region comprises:
a first effective pattern region where the transparent conductive pattern is located; and
a second effective pattern region where the metal pattern is located,
wherein the first effective pattern region overlaps the second effective pattern region.

6. The display device of claim 5, wherein the first effective pattern region has an area greater than an area of the second effective pattern region.

7. The display device of claim 2, wherein the conductive patterns are arranged in a first direction and a second direction perpendicular to the first direction.

8. The display device of claim 7, wherein the transparent conductive pattern has a rectangular shape elongated in the second direction, and
the metal pattern has a rectangular shape elongated in the first direction.

9. The display device of claim 7, wherein
the conductive patterns are formed in a zigzag pattern in one or more of the first and second directions.

10. The display device of claim 2, wherein the input detection unit further comprises:
a first insulating layer covering the metal pattern; and
a second insulating covering the transparent conductive pattern,
wherein the metal pattern is on the display unit, and
wherein the transparent conductive pattern is on the first insulating layer.

11. The display device of claim 1, wherein each of the conductive patterns comprises a metal pattern comprising a metallic material.

12. The display device of claim 11, wherein the pattern section is divided into a plurality of pattern regions that correspond to corresponding ones of the conductive patterns,
wherein each of the pattern regions comprises:
an effective pattern region where the metal pattern is located; and
an ineffective pattern region where the metal pattern is not located.

13. The display device of claim 12, wherein the effective pattern region has an area less than an area of the ineffective pattern region.

14. The display device of claim 12, wherein
the conductive patterns are arranged in a first direction and a second direction perpendicular to the first direction, and
the conductive patterns are formed in a zigzag pattern in one or more of the first and second directions.

15. The display device of claim 1, wherein the display unit comprises a first substrate, a second substrate facing the first substrate, and a sealant combining the first and second substrates with each other.

16. The display device of claim 15, wherein the display unit further comprises an organic layer including an opening that partially exposes the first and second power lines,
wherein the opening overlaps the sealant.

17. The display device of claim 15, wherein the pattern section partially overlaps the second power line and the sealant.

* * * * *